(12) United States Patent
Dalgaty et al.

(10) Patent No.: US 12,175,358 B2
(45) Date of Patent: Dec. 24, 2024

(54) NEUROMORPHIC ARCHITECTURE

(71) Applicants: Commissariat à l'Energie Atomique et aux Energies Alternatives, Paris (FR); Universität Zürich, Zurich (CH)

(72) Inventors: Thomas Dalgaty, Grenoble (FR); Giacomo Indiveri, Zurich (CH); Melika Payvand, Zurich (CH); Elisas Vianello, Grenoble (FR)

(73) Assignees: COMMISSARIAT À L'ENERGIE ATOMIQUE ET AUX ENERGIES ALTERNATIVES, Paris (FR); UNIVERSITÄT ZÜRICH, Zurich (CH)

( * ) Notice: Subject to any disclaimer, the term of this patent is extended or adjusted under 35 U.S.C. 154(b) by 1009 days.

(21) Appl. No.: 17/248,373

(22) Filed: Jan. 22, 2021

(65) Prior Publication Data
US 2021/0232905 A1    Jul. 29, 2021

(30) Foreign Application Priority Data
Jan. 24, 2020 (FR) ..................................... 2000698

(51) Int. Cl.
 G06N 3/063 (2023.01)
 G06N 3/04 (2023.01)
 H10B 63/00 (2023.01)

(52) U.S. Cl.
 CPC ........... *G06N 3/063* (2013.01); *G06N 3/04* (2013.01); *H10B 63/80* (2023.02)

(58) Field of Classification Search
None
See application file for complete search history.

(56) References Cited

U.S. PATENT DOCUMENTS

| | | | |
|---|---|---|---|
| 2011/0119214 A1 | 5/2011 | Breitwisch et al. | |
| 2016/0350643 A1 | 12/2016 | Hosokawa et al. | |
| 2018/0082168 A1 | 3/2018 | Marukame et al. | |
| 2018/0174026 A1* | 6/2018 | Davies | G06N 3/063 |
| 2019/0318232 A1 | 10/2019 | Cruz-Albrecht et al. | |

OTHER PUBLICATIONS

Yang, Yuanfan, Jimson Mathew, and Dhiraj K. Pradhan. "Matching in memristor based auto-associative memory with application to pattern recognition." In 2014 12th International Conference on Signal Processing (ICSP), pp. 1463-1468. IEEE, 2014. (Year: 2014).*

(Continued)

*Primary Examiner* — Vincent Gonzales
(74) *Attorney, Agent, or Firm* — Jordan IP Law, LLC

(57) ABSTRACT

The present disclosure relates to a routing circuit for routing signals between neuron circuits of an artificial neural network, the routing circuit comprising: a first memory cell (302) having an input coupled to a first input line (304) of the routing circuit and an output coupled to a first column line (308); a second memory cell (302) having an input coupled to a second input line (304) of the routing circuit and an output coupled to the first column line (308); and a first comparator circuit (310) configured to compare a signal (IREAD1) on the first column line (308) with a reference level, and to selectively assert a signal (VOUT1) on a first output line (312) of the routing circuit based on the comparison.

15 Claims, 14 Drawing Sheets

(56) References Cited

OTHER PUBLICATIONS

Thrivikramaru, Vinai, and Rajendra Kumar Baghel. "High speed low power CMOS current comparator." In 2012 International Conference on Communication Systems and Network Technologies, pp. 764-768. IEEE, 2012. (Year: 2012).*

Pisarev, A. D., A. N. Busygin, S. Yu Udovichenko, and O. V. Maevsky. "A biomorphic neuroprocessor based on a composite memristor-diode crossbar." Microelectronics Journal 102. Aug. 2020. (Year: 2020).*

Cruz-Albrecht, Jose M., Timothy Derosier, and Narayan Srinivasa. "A scalable neural chip with synaptic electronics using CMOS integrated memristors." Nanotechnology 24, No. 38, 2013. (Year: 2013).*

Preliminary Search Report for French Application No. 2000698 dated Oct. 20, 2020, 2 pages.

T. Mak et al., "Dynamic Programming Networks for Large-Scale 3D Chip Integration," IEEE Circuits and Systems Magazine, vol. 11, No. 3, Jan. 1, 2011, pp. 51-62.

E. Chicca et al., "Neuromorphic Electronic Circuits for Building Autonomous Cognitive Systems," Proceedings of the EEE, vol. 102, No. 9, Sep. 2014, pp. 1367-1388.

S. Moradi et al., "A Scalable Multicore Architecture With Heterogeneous Memory Structures for Dynamic Neuromorphic Asynchronous Processors (DYNAPs)," IEEE Transactions on Biomedical Circuits and Systems, vol. 12, No. 1, Feb. 2018, pp. 106-122.

M. Oster et al., "A Winner-Take-All Spiking Network with Spiking Inputs," Proceedings of the 2004 11th IEEE International Conference on Electronics, Circuits and Systems, 2004, 4 pages.

W. Maass et al., "Real-Time Computing Without Stable States: A New Framework for Neural Computation Based on Perturbations. Neural Computation," 14(11), 2002, pp. 2531-2560.

* cited by examiner

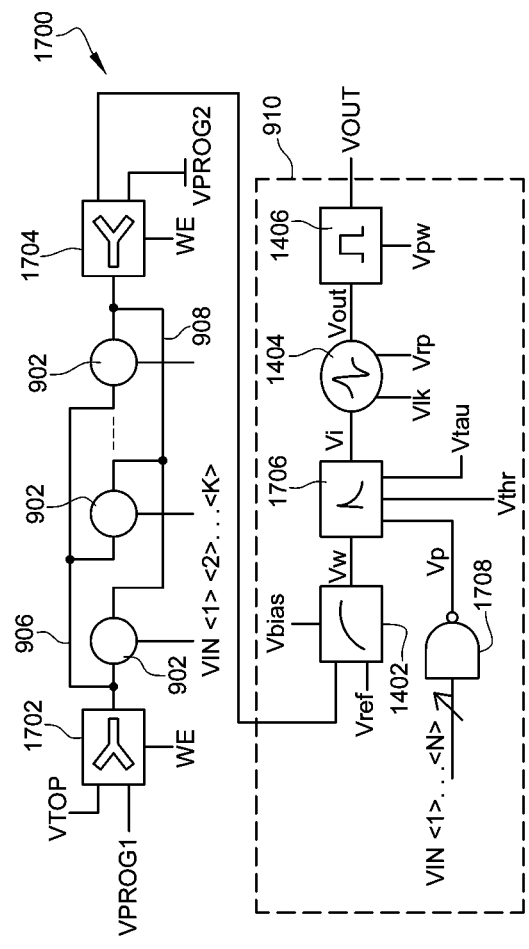
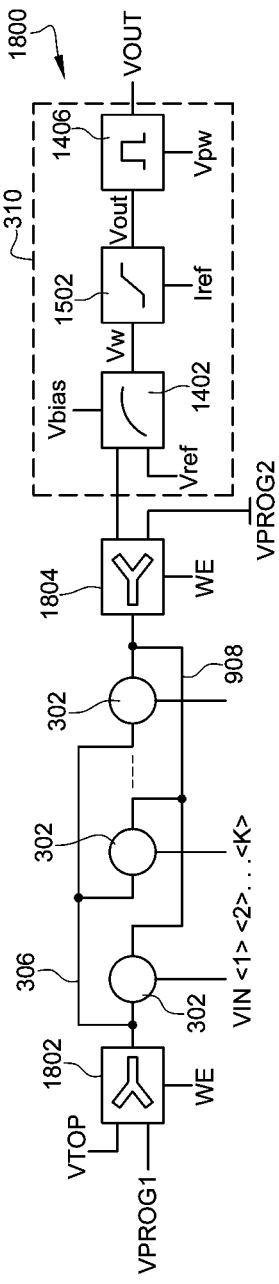
Fig. 17
Fig. 18

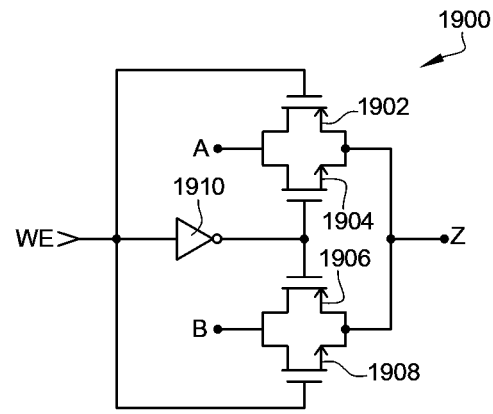
Fig. 19
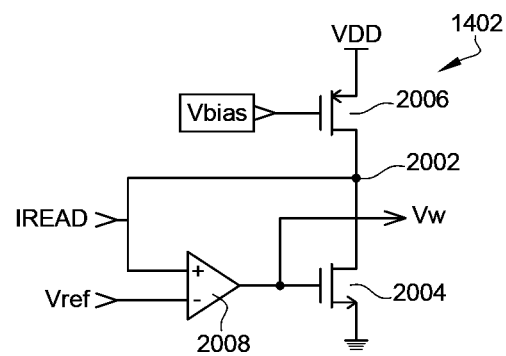
Fig. 20
Fig. 21
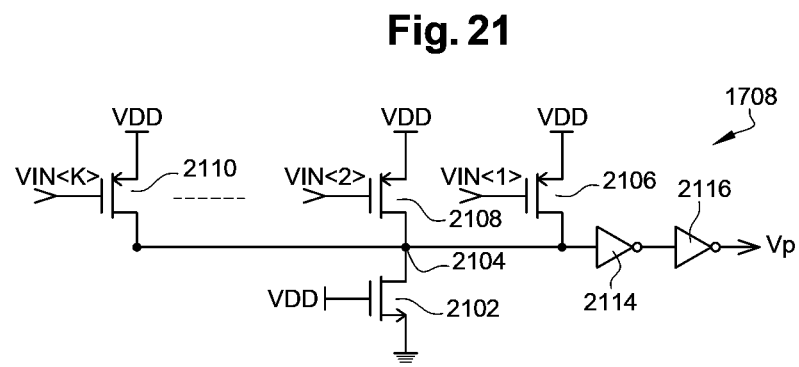

NEUROMORPHIC ARCHITECTURE

FIELD

The present disclosure relates generally to the field of neural networks, and in particular to a neuromorphic architecture and to a method of routing signals in a neural network having such a neuromorphic architecture.

BACKGROUND

Neuromorphic processors are computing architectures that are developed to mimic, to a certain extent, neurobiological systems. Such neural networks generally comprise a network of artificial neurons, which are electrical circuits that receive inputs, combine these inputs with their internal state and often with a threshold, and produce an output signal. Outputs of neurons are coupled to the inputs of other neurons by connections, which are often referred to as synapses, their equivalent in the biological brain.

In a neural network, signals, sometimes in the form of spikes, produced by source neurons are transmitted to one or more destination synapse circuits, which perform one or more transformations on the signal before they are integrated, possibly with different gain factors, and conveyed to one or more post-synaptic neurons. The function used to generate the input to a post-synaptic neuron, based on the outputs of its predecessor neurons and the connections as a weighted sum, is known as the propagation function.

It has been proposed to use content addressable memories (CAMs) in order to implement the complex programmable connections between neurons in a neural network. For example, the Address-Event Representation (AER) is a communications protocol commonly adopted in neural network architectures to implement routing between neurons. For example, a system based on such an approach is described in the publication entitled "A Scalable Multicore Architecture With Heterogeneous Memory Structures for Dynamic Neuromorphic Asynchronous Processors (DYNAPs)", S. Moradi et al., IEEE transactions on biomedical circuits and systems Vol. 12, no. 1, February 2018.

According to AER, each neuron is assigned an address. When a neuron fires, its address is asserted on a shared digital bus. After a firing event, each neuron compares, in a CAM, the address of the firing neuron with the addresses of a finite number of neurons to which it is virtually connected. For each address hit, the corresponding post-synaptic neuron will locally generate a pulse for itself. Thus, programming the CAM permits custom neural network topologies to be configured.

However, the AER approach has disadvantages dues to the limited fan-in and fan-out that is possible to/from each neuron, and in terms of static power consumption, which is relatively high.

SUMMARY

It is an aim of embodiments of the present disclosure to at least partially address one or more disadvantages in the prior art.

According to one aspect, there is provided a routing circuit for routing signals between neuron circuits of an artificial neural network, the routing circuit comprising: a first memory cell having an input coupled to a first input line of the routing circuit and an output coupled to a first column line; a second memory cell having an input coupled to a second input line of the routing circuit and an output coupled to the first column line; and a first comparator circuit configured to compare a signal on the first column line with a reference level, and to selectively assert a signal on a first output line of the routing circuit based on the comparison.

According to one embodiment, the routing circuit further comprises: a third memory cell having an input coupled to the first input line of the routing circuit and an output coupled to a second column line; a fourth memory cell having an input coupled to the second input line of the routing circuit and an output coupled to the second column line; and a second comparator circuit configured to compare a signal on the second column line with a reference level, and to selectively assert a signal on a second output line of the routing circuit based on the comparison.

According to one embodiment, the first memory cell is configured to store a first activation bit, and the first memory cell is configured to assert a signal on the first column line when the first activation bit and a signal on the first input line of the routing circuit are asserted; and the second memory cell is configured to store a second activation bit, the second memory cell being configured to assert a signal on the first column line when the second activation bit and a signal on the second input line of the routing circuit are asserted.

According to one embodiment, the first and second memory cells are configured to assert current signals on the first column line.

According to one embodiment, the first and second memory cells comprise non-volatile storage elements, such as resistive memory elements.

According to a further aspect, there is provided an artificial neural network comprising a plurality of neuron circuits, each neuron circuit having at least one input line and at least one output line; and a plurality of the above routing circuits, each routing circuit coupling one or more output lines of one or more of the neuron circuits to one or more input lines of one or more of the neuron circuits.

According to one embodiment, each neuron circuit comprises: a first memory cell having an input coupled to a first input line of the neuron circuit and an output coupled to a first column line of the neuron circuit; a second memory cell having an input coupled to a second input line of the routing circuit and an output coupled to the first column line of the neuron circuit; and a first computation circuit configured to compare a signal on the first column line of the neuron circuit with a reference level, and to selectively assert a signal on a first output line of the neuron circuit based on the comparison.

According to one embodiment, the artificial neural network further comprises: a third memory cell having an input coupled to the first input line of the neuron circuit and an output coupled to a second column line of the neuron circuit; a fourth memory cell having an input coupled to the second input line of the neuron circuit and an output coupled to the second column line; and a second computation circuit configured to compare a signal on the second column line of the neuron circuit with a reference level, and to selectively assert a signal on a second output line of the neuron circuit based on the comparison.

According to one embodiment, the plurality of neuron circuits and the plurality of routing circuits are formed in a plurality of layers of a 3-dimensional circuit structure.

According to a further aspect, there is provided a method of routing signals between neuron circuits of an artificial neural network, the method comprising: programming a first memory cell having an input coupled to a first input line of the routing circuit and an output coupled to a first column line; programming a second memory cell having an input coupled to a second input line of the routing circuit and an output coupled to the first column line; comparing, by a first comparator circuit, a signal on the first column line with a reference level; and selectively asserting a signal on a first output line of the routing circuit based on the comparison.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 17 schematically illustrates a column of a neuron tile in more detail according to an example embodiment of the present disclosure;

FIG. 18 schematically illustrates a column of a routing tile in more detail according to an example embodiment of the present disclosure;

FIG. 19 schematically illustrates a multiplexer/demultiplexer of the neuron and routing columns of FIGS. 17 and 18 in more detail according to an example embodiment of the present disclosure;

FIG. 20 schematically illustrates a current buffer of the neuron and routing columns of FIGS. 17 and 18 in more detail according to an example embodiment of the present disclosure;

FIG. 21 schematically illustrates a half NAND circuit of the neuron column of FIG. 17 in more detail according to an example embodiment of the present disclosure;

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, techniques for training a neural network and application for using neural networks are well known to those skilled in the art, and have not been described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
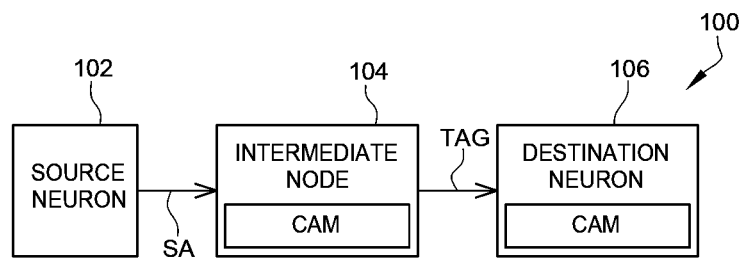
FIG. 1 schematically illustrates a link in a neural network comprising neuron circuits and a synapse circuit according to an example embodiment.

FIG. 1 schematically illustrates a link 100 in a neural network comprising neuron circuits and a synapse circuit according to an example embodiment that has been proposed. For example, an approach similar to that of FIG. 1 is described in the publication by S. Moradi et al. referenced in the background section above. The approach is based on point-to-point source address routing and multi-cast destination-address routing. As represented in FIG. 1, when a source neuron (SOURCE NEURON) 102 fires, its source address SA is used to target a subset of intermediate nodes (INTERMEDIATE NODE) 104, one of which is shown in FIG. 1 comprising a content addressable memory (CAM). For example, each intermediate node compares the source address SA with addresses stored in its CAM, and if there is a hit, the intermediate node is identified as a targeted node. Each targeted intermediate node 104 broadcasts the incoming event, along with a tag (TAG), to the neurons in its sector. These neurons also comprise a CAM, and will compare the tag with values in its CAM to determine whether it is a destination neuron for the firing event, one such destination neuron (DESTINATION NEURON) 106 being represented in FIG. 1.

As mentioned above, the AER approach, or similar approaches that make use of a CAM, have disadvantages in terms of configurability and also due to the limited fan-in and fan-out that is possible to/from each neuron.

Figure 2:
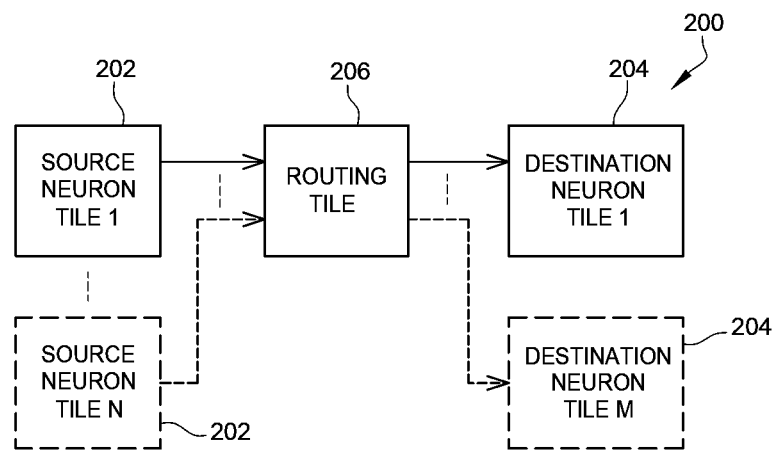
FIG. 2 schematically illustrates part of a neural network comprising neuron tiles and a routing tile according to an example embodiment of the present disclosure.

FIG. 2 schematically illustrates a link 200 in a neural network comprising N source neuron tiles (SOURCE NEURON TILE 1, SOURCE NEURON TILE N) 202 coupled to M destination neuron tiles (DESTINATION NEURON TILE 1, DESTINATION NEURON TILE M) 204 via a routing tile (ROUTING TILE) 206. The number N of source neuron tiles 202 linked by the routing tile 206 is for example equal to at least one, and the number M of destination neuron tiles 204 linked by the routing tile 206 is also for example equal to at least one. Furthermore, while a single routing tile 206 is illustrated in FIG. 1 linking the source and destination routing tiles, in some embodiments there could be a series connection of more than one routing tile 206 performing the linking operation, as will be described in more detail below.

Figure 3:
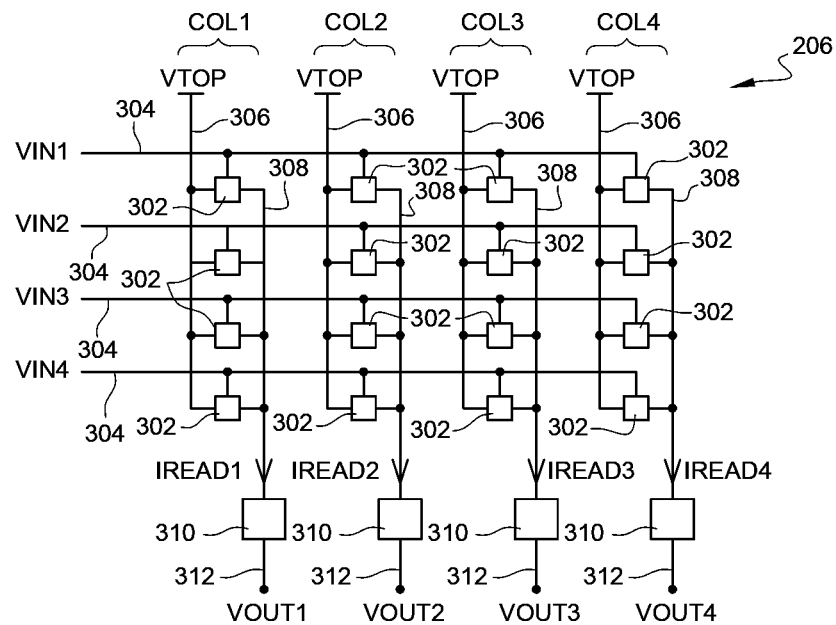
FIG. 3 schematically illustrates the routing tile of FIG. 2 in more detail according to an example embodiment of the present disclosure.

FIG. 3 schematically illustrates the routing tile 206 of FIG. 2 in more detail according to an example embodiment. The routing tile 206 for example comprises one or more columns, and FIG. 3 illustrates an example in which it comprises four columns COL1 to COL4. Each column for example comprises one or more memory cells 302. In the example of FIG. 3, each column COL1 to COL4 comprises four such memory cells 302.

The memory cells 302 store routing data for routing signals between the columns and the output lines.

Each memory cell 302 receives a corresponding tile input line 304 from one or more source neuron tiles (not shown in FIG. 3), there being four such tile input lines, labelled VIN<1> to VIN<4>, in the example of FIG. 3.

Each memory cell 302 selectively couples, based on its programmed state and on an input voltage, a column supply voltage line 306 (VTOP) to a column line 308. Indeed, each memory cell 302 for example comprises a programmable propagation element, such as a programmable resistance, configured such that the column supply voltage line 306 is applied by the memory cell 302 via the propagation element to the column line 308 only if the input voltage is at a high state and if the propagation element is programmed to propagate this state.

In some embodiments, the output signals from all of the memory cells 302 of a column are combined on a single column line 308 in the form of a read current IREAD. In the example of FIG. 3, the column lines 308 of the four columns COL1 to COL4 respectively provide read currents IREAD1 to IREAD4.

Each column of the routing tile 206 further comprises a comparator circuit 310, which for example compares the current signal TREAD on the corresponding column line 308 to a threshold value. The comparator circuit 310 generates, based on this comparison, an output voltage VOUT on a corresponding tile output line 312. The output voltage VOUT is for example a binary signal based on a binary comparison between the signal IREAD and the threshold value. In the example of FIG. 3, the four columns COL1 to COL4 of the routing tile 206 respectively generate output voltages VOUT1 to VOUT4 on four corresponding tile output lines 312. The tile output lines 312 are provided to one or more destination neuron tiles (not shown in FIG. 3).

As explained above, while the tile input lines 304 and the tile output lines 312 may be connected directly to one or more source/destination neuron tiles, they could additionally or alternatively be coupled to one or more source/destination neuron tiles via one or more further routing tiles 206 (not illustrated in FIG. 3).

In some embodiments, each of the memory cells 302 of the routing tile is programmed in a binary manner to have one of only two states, and the comparator circuit 310 is for example configured to generate a voltage pulse at its output if at least one memory cell 302 of the column is programmed with a low resistance state and receives a voltage pulse on its input line.

However, in alternative embodiments, the memory cells 302 could be programmed to have one of more than two resistance states, such as one of four or eight resistance states. In such a case, the comparator circuit 310 is for example configured to perform a more complex comparison in order to decide whether or not to generate an output pulse.

Furthermore, in some cases, the routing of the pulse could be dependent on the particular programmed resistance state of the memory cell. For example, each comparator circuit 310 is for example configured to generate a plurality of output voltages on a corresponding plurality of output lines 312, and to assert a voltage pulse on one of its output lines 312 depending on the level of the current IREAD on the corresponding column line 306. For example, in such a case, each comparator circuit 310 comprises more than one comparator, enabling more than two amplitude levels of the read current IREAD to be distinguished. Additionally or alternatively, one or more of the output voltages VOUT1 to VOUT4 could be generated by a logic circuit (not illustrated) as a function of two or more of the output signals of the comparators 310.

Figure 4:
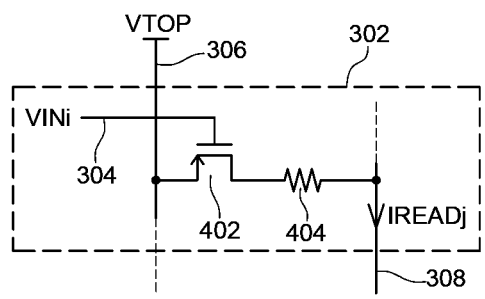
FIG. 4 schematically illustrates a memory cell of the routing tile of FIG. 3 in more detail according to an example embodiment of the present disclosure.

FIG. 4 schematically illustrates a memory cell 302 of the routing tile of FIG. 3 according to an example embodiment according to which it is implemented by a 1T1R (one transistor, one resistor) structure in which the resistor is a non-volatile memory element based on resistive memory, such as RRAM (resistive random access memory). In particular, each memory cell 302 for example comprises a transistor 402 having one of its main current conducting nodes coupled to the column supply voltage line 306. The transistor 402 is for example controlled at its gate by a voltage VINi on the tile input line 304, where i is 1, 2, 3 or 4 for each corresponding row in the example of FIG. 3. The other main current conducting node of the transistor 402 is for example coupled, via a programmable resistive element 404, to the column line 308, which provides a read current IREADj, where j is 1, 2, 3 or 4 for each corresponding row in the example of FIG. 3.

In the embodiment of FIG. 4, the transistor 402 is a p-channel MOS (PMOS) transistor, and the input signal VINi is active low, in other words the transistor becomes conductive when the voltage VINi is at a low voltage state. In alternative embodiments, the transistor 402 could be implemented by an n-channel MOS (NMOS) transistor, and the input signal VINi could be active high, in other words the transistor becomes conductive when the voltage VINi is at a high voltage state. Furthermore, the order of the transistor 402 and the programmable resistive element 404 between the voltage rail VTOP and the column line 308 could be inversed.

In alternative embodiments, the programmable resistive element 404 could be implemented by other types of non-volatile technology, such as CBRAM (conductive bridging RAM), OxRAM (oxide based resistive memory), MRAM (magneto-resistive RAM), FTJ (ferroelectric tunnel junction), FeFET (ferroelectric field effect transistors), or the like.

In some embodiments, the resistive state of the memory element 404 is programmed by a current or voltage applied to the programmable resistive element 404, or by other techniques, depending on the technology of the element.

In alternative embodiments, rather than being implemented by a non-volatile memory cell, each of the memory cells 302 of the routing tile could be implemented by a volatile memory cell, such as an SRAM (static RAM) cell.

Figure 5A:
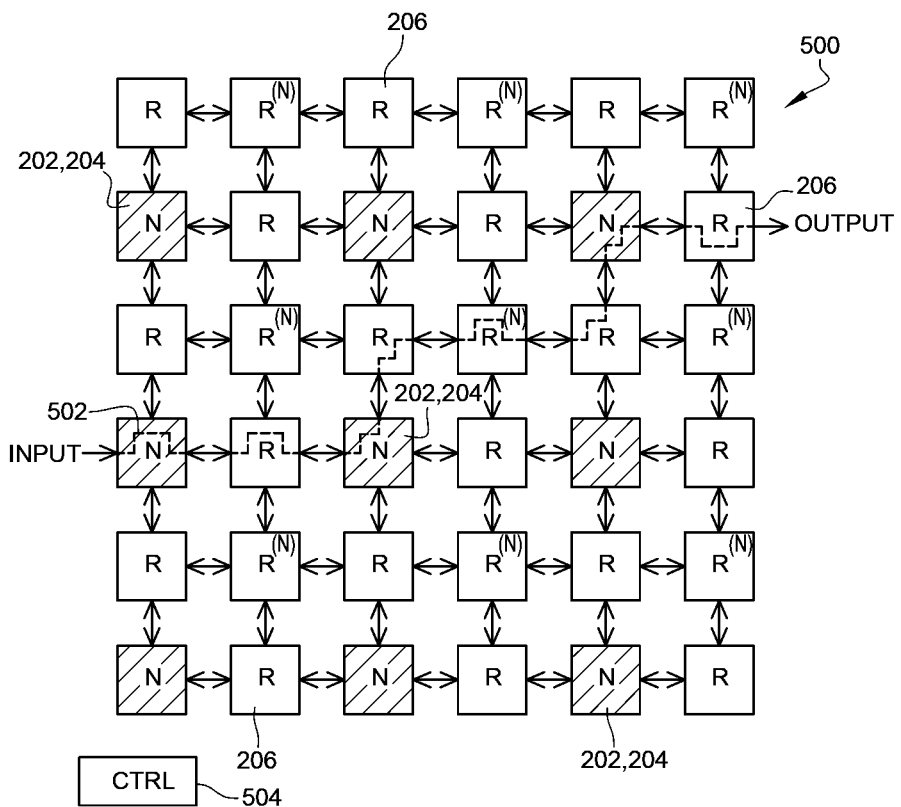
FIG. 5A schematically illustrates a neural network comprising neuron tiles and routing tiles according to an example embodiment of the present disclosure.

FIG. 5A schematically illustrates a neural network 500 comprising neuron tiles 202, 204 (N) and routing tiles 206 (R) arranged in a grid of columns and rows according to an example embodiment. The neuron tiles 202, 204 may each correspond to source neuron tiles 202 and/or destination neuron tiles 204. The example of FIG. 5A comprises nine neuron tiles, and three routing tiles per neuron tile. In particular, the network is formed of two-by-two blocks each having one neuron tile, which in the example of FIG. 5A is positioned as the bottom left tile of each two-by-two block, and the remaining three tiles of each two-by-two block are the routing tiles.

In some embodiments, each neuron tile and each routing tile has a set of inputs and outputs on each of its sides. For example, each of the neuron tiles and each of the routing tiles has one or more input lines coupled to its neighboring neuron or routing tile or tiles in the row and column directions, and one or more output lines coupled to its neighboring neuron or routing tile or tiles in the row and column directions. Thus, by programming the memory cells 302 (not illustrated in FIG. 5A) in each routing tile, the output lines of each neuron can be coupled to one or more input lines of one or more other neurons.

External input and output lines of the neural network 500 are for example coupled to inputs and outputs respectively of one or more of the routing and/or neuron tiles. For example, as will be described in more detail below with reference to FIG. 12, in some embodiments, one or more of the routing and/or neuron tiles may have a memory array having one or more additional rows for receiving such external input signals.

An example of a propagation path through the neural network 500 is illustrated by a dashed track 502 in FIG. 5A, whereby an external input signal INPUT to the network is received by a neuron tile on the left-hand side of the array of tiles, and is routed via two further neuron tiles and intermediate routing tiles before providing an output signal OUTPUT at the right-hand side of the array of tiles, the signal OUTPUT providing an external output of the network.

Of course, while FIG. 5A illustrates an example of a relatively small network of 6 by 6 tiles, in practice a neural network of the type shown in FIG. 5A could have any number of columns and rows, and comprise thousands or even millions of neuron and routing tiles. Furthermore, the example of FIG. 5A, in which there are three routing tiles per neuron tile, is merely one example, and in alternative embodiments there could be a different ratio between neuron and routing tiles. For example, there could be equal numbers of neuron and routing tiles, the neuron tiles for example being arranged in columns or rows, or in a checkerboard pattern.

The neural network 500 also for example comprises a control circuit (CTRL) 504 that is for example configured to program the configuration of the network, for example by programming the memory cells of the routing tiles, as will be described in more detail below.

Figure 5B:
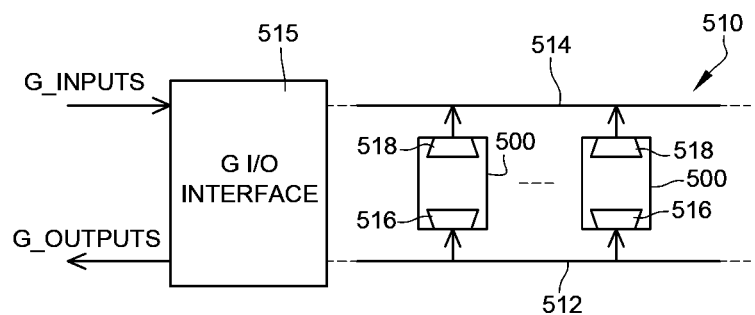
FIG. 5B schematically illustrates a system comprising several neural networks according to an example embodiment of the present disclosure.

FIG. 5B illustrates a system 510 comprising a plurality of the neural networks 500 each receiving external input signals via a bus 512, and providing external output signals via a bus 514. The buses 512, 514 are for example coupled to a global input/output interface (G I/O INTERFACE) 515, which for example receives global inputs (G_INPUTS) and provides global outputs (G_OUTPUTS). Each of the neural networks 500 for example comprises, in addition to an array of neuron and routing tiles, like those of FIG. 5A, an input interface 516 coupled to the bus 512, and an output interface 518 coupled to the bus 514. In some embodiments, the global interface 515, the buses 512, 514 and the input and output interfaces 516, 518 operate based on the Address-Event Representation protocol.

While FIG. 5A is based on an example of a 2-dimensional (2D) array of neuron and routing tiles, in some embodiments the neural network 500 could have a 3-dimensional (3D) architecture comprising a plurality of stacked 2D arrays. In such an architecture, rather than there being four sets of input/output lines to and from each neuron and routing tile, there could be five or six sets, comprising, in addition to the north, east, south and west sets, an upward set communicating with a routing or neuron tile in a layer above (if present), and/or a downward set communicating with a routing tile in a layer below (if present).

For example, in the case of a first 2D layer having the arrangement of the neuron and routing tiles of FIG. 5A, an adjacent 2D layer formed over the first 2D layer, and/or an adjacent 2D layer formed under the first 2D layer, could for example be formed of only routing tiles. Alternatively, the adjacent 2D layer(s) could be formed to have neuron and routing tiles in a similar pattern to the one of FIG. 5A, but offset, for example such that the neuron tiles are positioned above the routing tiles of the first 2D layer that are in rows and columns without neuron tiles. These routing tiles are indicated by the reference (N) in FIG. 5A.

Figure 6:
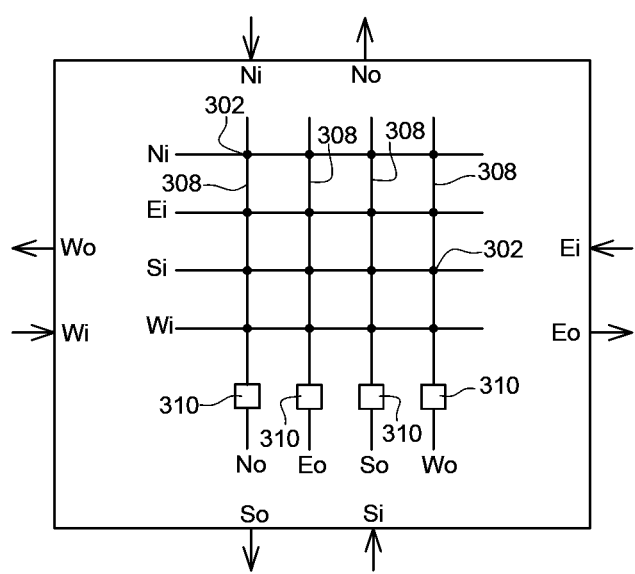
FIG. 6 schematically illustrates a routing tile in more detail according to a further example embodiment of the present disclosure.

FIG. 6 schematically illustrates the routing tile 206 of FIG. 5A in more detail according to an example embodiment in which it comprises four sets of inputs and outputs, the sets being respectively coupled to neighboring tiles of the column and of the row. In the present disclosure, the sets of connections to the neighboring tile above, to the neighboring tile to the right, to the neighboring tile below, and to the neighboring tile to the left in the network will be referred to a north, east, south and west sets of connections.

In the example of FIG. 6, each of the north, east, south and west sets of connections consists of a single input lines Ni, Ei, Si, and Wi respectively, and a single output lines No, Eo, So and Wo respectively. Furthermore, the array of memory cells 302 in the example of FIG. 6 is a 4 by 4 array, each memory cell being represented by a dot. Each of the four inputs Ni, Ei, Si and Wi is coupled, by corresponding memory cells 302, to each of four column lines 308. Each of the four column lines 308 is coupled to a corresponding comparator circuit 310 of the column, the comparator circuit 310 of the four columns providing signals to the respective output line No, Eo, So and Wo.

Thus, in the example of FIG. 6, by programming each of the memory cells 302, it is possible to route input signals present at any of the input lines Ni, Ei, Si and Wi, to one or more of the output lines No, Eo, So and Wo.

The example of FIG. 6 is based on an array of memory cells having a number of rows equal to the number of input lines of the routing tile, and a number of columns equal to the number of output lines of the routing tile. This solution thus permits maximum versatility in the routing that is possible, in other words, signals can be independently routed. As will be explained in more detail below, in other less versatile embodiments in which path sharing is implemented between inputs and/or outputs, the choices of routing for some signals is, to some extent, dependent on the routing of other signals.

Columns of the routing tiles can be shared by more than one input line, and thus by a plurality of source neurons. Indeed, there is a relatively low probability of two source neurons firing at the same time, which could cause one firing event to hide another. However, as the number of source neurons sharing columns increases, the risk of simultaneous firing events increases, and it can be desirable to increase the number of input lines and/or output lines of each routing tile in order to accommodate a greater number of transmission paths. Indeed, this will reduce path sharing and provide greater configurability.

The approach of FIG. 6 could be extended to a greater number of input lines and/or output lines. For example, in the case of two input lines and two output lines per north, east, south and west set, there would be eight rows and eight columns, and thus an array of 64 memory cells. In the case of four input lines and four output lines per north, east, south and west set, there would be 16 rows and 16 columns, and thus an array of 256 memory cells.

To reduce to some extent the size of the memory cell array in each routing tile while providing a relatively high number of input and/or output lines, common input lines and/or output lines can be provided, as will now be described in more detail with reference to FIGS. 7 and 8.

Figure 7:
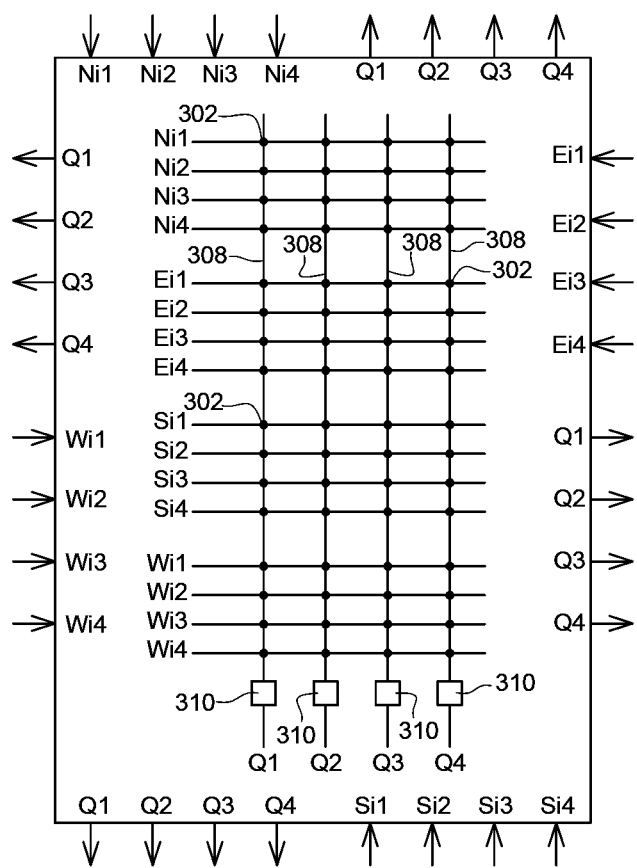
FIG. 7 schematically illustrates a routing tile in more detail according to yet a further example embodiment of the present disclosure.

FIG. 7 schematically illustrates the routing tile 206 of FIG. 5A in more detail according to a further example embodiment.

In the example of FIG. 7, each of the sets of input and output lines of the tile consists of four input lines, respectively labelled Ni1 to Ni4, Ei1 to Ei4, Si1 to Si4 and Wi1 to Wi4, and four output lines Q1 to Q4, which are common among the sets. The 16 input lines are coupled, by 16 corresponding rows of the memory cells 302, to each of four column lines 308, each comprising a comparator circuit 310. The comparator circuits coupled to the four column lines respectively generate the signals Q1, Q2, Q3 and Q4.

Thus, in the example of FIG. 7, by programming each of the memory cells 302, it is possible to route input signals present at any one of the 16 input lines to one or more of the common output lines Q1, Q2, Q3 and Q4. By providing the common output lines Q1, Q2, Q3 and Q4, the array of memory cells 302 can be much smaller than if the outputs were individually programmable for each set, like in the example of FIG. 6, which would require 256 memory cells, rather than 64 memory cells, and the number of comparator circuits 310 can also be reduced from 16 to 12. If, for example, it is only desired to route an input line in one, or some, of the north, east, south and west directions, the memory cells of the neighboring neuron or routing tiles are for example programmed accordingly to achieve this result.

Figure 8:
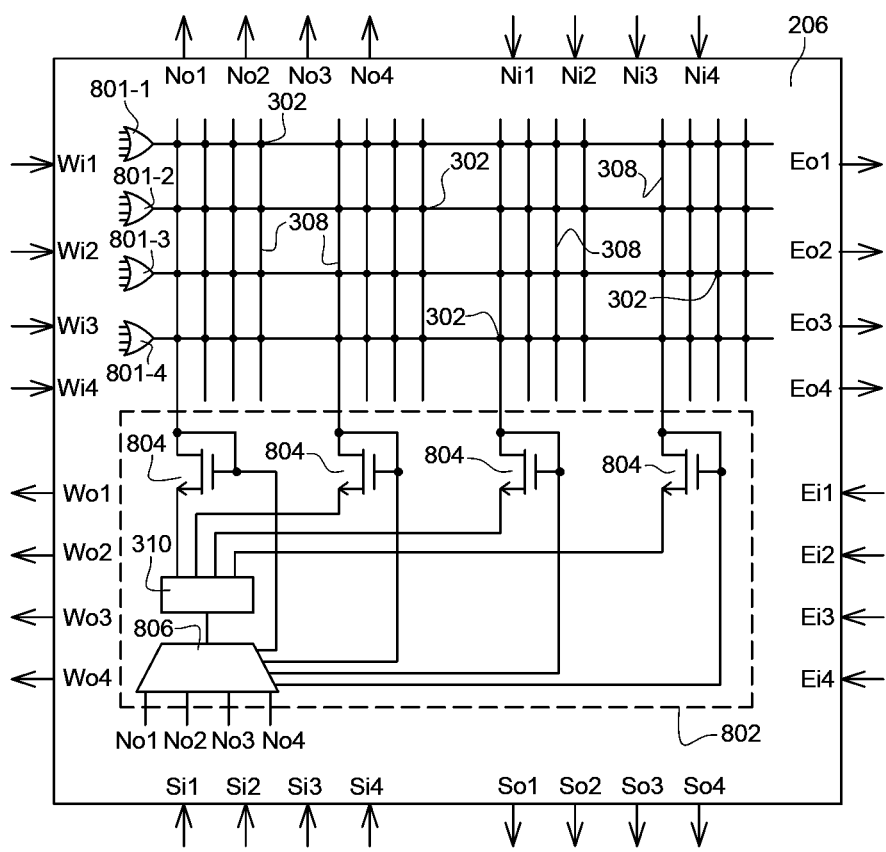
FIG. 8 schematically illustrates a routing tile having a shared comparator circuit according to an example embodiment of the present disclosure.

FIG. 8 schematically illustrates the routing tile 206 of FIG. 5A in more detail according to yet a further example embodiment.

In the example of FIG. 8, each of the sets of input and output lines of the tile consists of four input lines, respectively labelled Ni1 to Ni4, Ei1 to Ei4, Si1 to Si4 and Wi1 to Wi4, and four output lines, respectively labelled No1 to No4, Eo1 to Eo4, So1 to So4 and Wo1 to Wo4. However, the 16 input lines are for example combined, by four 4-input OR gates 801-1 to 801-4, onto four lines.

For example, in some embodiments, the OR gate 801-1 combines the inputs Ni1, Ei1, Si1 and Wi1, the OR gate 801-2 combines the inputs Ni2, Ei2, Si2 and Wi2, the OR gate 801-3 combines the inputs Ni3, Ei3, Si3 and Wi3, and the OR gate 801-4 combines the inputs Ni4, Ei4, Si4 and Wi4.

Alternatively, the OR gate 801-1 could combine the four north inputs Ni1 to Ni4, the OR gate 801-2 could combine the four east inputs Ei1 to Ei4, the OR gate 801-3 could combine the four south inputs Si1 to Si4, and the OR gate 801-4 could combine the four west inputs Wi1 to Wi4.

The outputs of the four OR gates 801-1 to 801-4 are coupled, by four corresponding rows of the memory cells 302 to each of 16 column lines 308. The tile 206 further comprises four comparator blocks 802 in the example of FIG. 8, one of which is illustrated. In the example of FIG. 8, each comparator block 802 comprises a single comparator circuit 310, which is shared by more than one column of memory cells 302. For example, each comparator block 802 in FIG. 8 is coupled to four columns and generates the four output signals associated with one of the sets of signals. FIG. 8 illustrates the comparator block 802 generating the set of output signals No1, No2, No3 and No4. Three other comparator blocks 802 (not illustrated) for example respectively generate the three sets of output signals Eo1 to Eo4, So1 to So4 and Wo1 to Wo4.

Each comparator block 802 for example comprises diode-connected transistors 804, a corresponding one of which coupling each of the input column lines of the comparator block 802 to a corresponding input of the comparator circuit 310. For example, each of the transistors 804 is an n-channel MOS transistor having its gate and drain coupled to the column line, and its source coupled to the comparator circuit 310.

An output of the comparator circuit 310 is coupled to a demultiplexer (demultiplexer) 806, which generates the four output signals No1 to No4. The demultiplexer 806 has four control inputs coupled to the four column lines of the comparator block 802, and selects one of the output lines based on a one-hot representation on the control inputs. Indeed, when a signal is asserted on one of the column lines of the comparator block 802, the signal will be supplied to the comparator circuit 310, and will also cause the demultiplexer 806 to select the output lines No1, No2, No3 or No4 that is associated with the column line.

Of course, rather than sharing a comparator circuit 310 among each set of outputs of the routing tile, comparator circuits 310 could be shared in a different manner. For example, one comparator circuit 310 could be used to generate the first output No1, Eo1, So1 and Wo1 of each set of input/output lines of the routing tile, another to generate the second output No2, Eo2, So2 and Wo2 of each set of input/output lines of the routing tile, etc.

Figure 9:
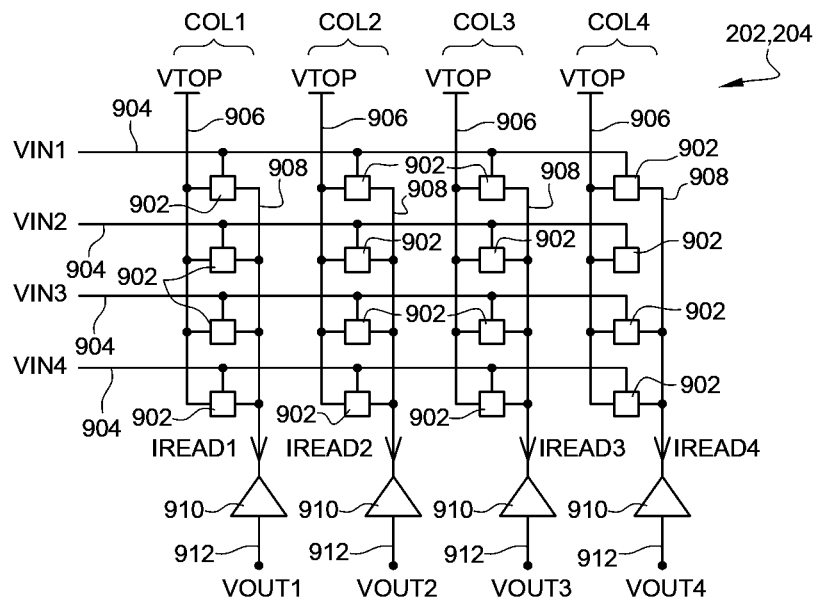
FIG. 9 schematically illustrates a neuron tile of FIGS. 2 and 5 in more detail according to an example embodiment of the present disclosure.

FIG. 9 schematically illustrates the source or destination neuron tile 202, 204 of FIGS. 2 and 5 in more detail according to an example embodiment.

Each neuron tile 202, 204 for example has a similar structure to a routing tile, and comprises in particular one or more columns of memory cells 902. FIG. 9 illustrates an example in which the neuron tile comprises four columns COL1 to COL4 each comprising one or more memory cells 902. In the example of FIG. 9, each column COL1 to COL4 comprises four such memory cells 902.

The memory cells 902 store for example synaptic weights.

Each memory cell 902 receives a corresponding tile input line 904, which is for example coupled to a routing tile (not shown in FIG. 9) or to an external input of the neural network. There are four input lines 904 in the example of FIG. 9, respectively receiving input signals VIN<1> to VIN<4>.

Each memory cell 902 is for example configured to selectively couple, based on its programmed state, a column supply voltage line 906 (VTOP) to a column line 908. For example, each memory cell 902 stores an activation bit, and is configured to assert a signal on its corresponding column line 908 when both the activation bit, and a signal on the input line 904 of the routing circuit, are asserted, in other words are at a state causing the conduction of a current by the memory cell.

For example, the output signals from all of the memory cells 902 of a column are combined on a single column line 908 in the form of a read current IREAD. In the example of FIG. 9, the column lines 908 of the four columns COL1 to COL4 respectively provide read currents IREAD1 to IREAD4.

Each column of the neuron tile 202, 204 further comprises a computation circuit 910, which for example generates, on a corresponding output line 912 of the neuron tile, an output signal VOUT based on the current signal IREAD on the corresponding column line 908. In the example of FIG. 9, the four columns COL1 to COL4 of the neuron tile 202, 204 respectively generate output voltages VOUT1 to VOUT4 on four corresponding tile output lines 912. The tile output lines 912 are for example provided, via one or more routing tiles 206 (not shown in FIG. 9), to one or more destination neuron tiles (also not shown in FIG. 9) and/or to one or more external outputs of the neural network.

Each memory cell 902 is for example implemented by a same or similar circuit to the memory cells 302 of the routing tiles.

In operation, each computation circuit 910 for example accumulates the signal on its corresponding column line on one or more capacitors, until the voltage across the one or more capacitors exceeds a threshold voltage, at which point the computation circuit 910 for example fires, in other words an output signal is generated on the output line 912, and the capacitor voltage is reset.

Figure 10:
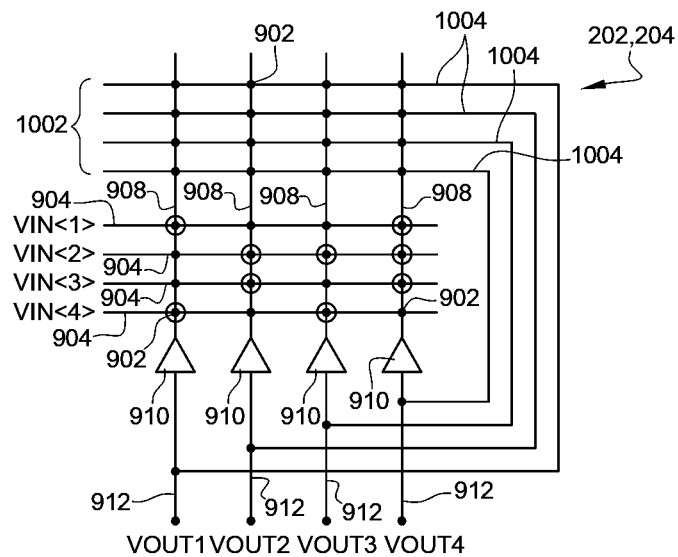
FIG. 10 schematically illustrates a neuron tile of FIGS. 2 and 5 in more detail according to a further example embodiment of the present disclosure.

FIG. 10 schematically illustrates source and/or destination neuron tile 202, 204 of FIG. 3 in more detail according to a further example embodiment. The neuron tile 202, 204 of FIG. 10 is for example the same as that of FIG. 9, and its memory array comprises an additional portion 1002 of memory cells 902 providing feedback paths. In particular, each of the output lines 912 of computation circuit 910 of the neuron tile 202, 204 is for example provided to a corresponding further row 1004 of the additional portion 1002 of the memory array. Each memory cell 902 of the portion 1002 for example receives the signal VOUT1, VOUT2, VOUT3 or VOUT4 on the corresponding row, and also the column supply voltage (not shown in FIG. 10), and has its output coupled to a corresponding one of the column lines 908. Thus, the additional portion 1002 allows the tile's outputs to form additional inputs, also known as recurrent connections, to each column of the neuron circuit.

In the examples of the neuron circuit 202, 204 of FIGS. 9 and 10, the signal seen by each computation circuit 910 will correspond to the addition of each of the signals generated by each memory cell 902, and the computation circuit 910 for example accumulates the signals present on the corresponding column line 908 as positive signals. In some embodiments, there may additionally be one or more inhibitive inputs to each computation circuit 910, corresponding to signals that are subtracted from the accumulated signals, as will now be described in more detail with reference to FIG. 11.

Figure 11:
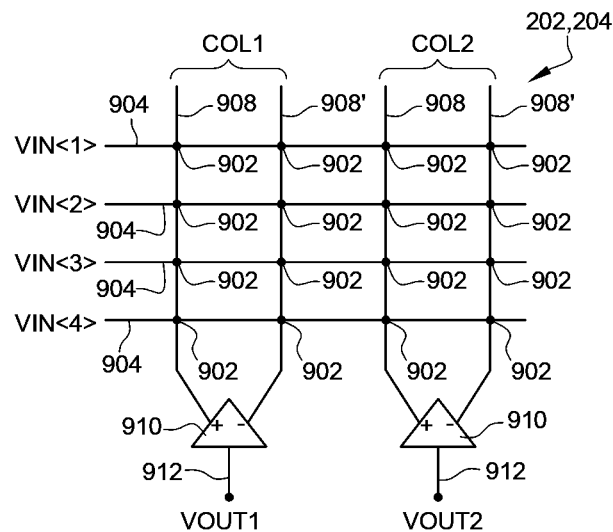
FIG. 11 schematically illustrates a neuron tile of FIGS. 2 and 5 in more detail according to yet a further example embodiment of the present disclosure.

FIG. 11 schematically illustrates the neuron tile 202, 204 in more detail according to yet a further example embodiment. The embodiment of FIG. 11 comprises two columns COL1, COL2, which are similar to the columns COL1 and COL2 of FIG. 9, except that each column comprises a pair of column lines 908, 908'. Each column line 908 is coupled to a positive input of the computation circuit 910 of its corresponding column, while each column line 908' is coupled to a negative input of the computation circuit 910 of its corresponding column. The computation circuit 910 for example generates the output signal on its output line 912 as a function of the signals on each of the corresponding column lines 908, 908'.

Figure 12:
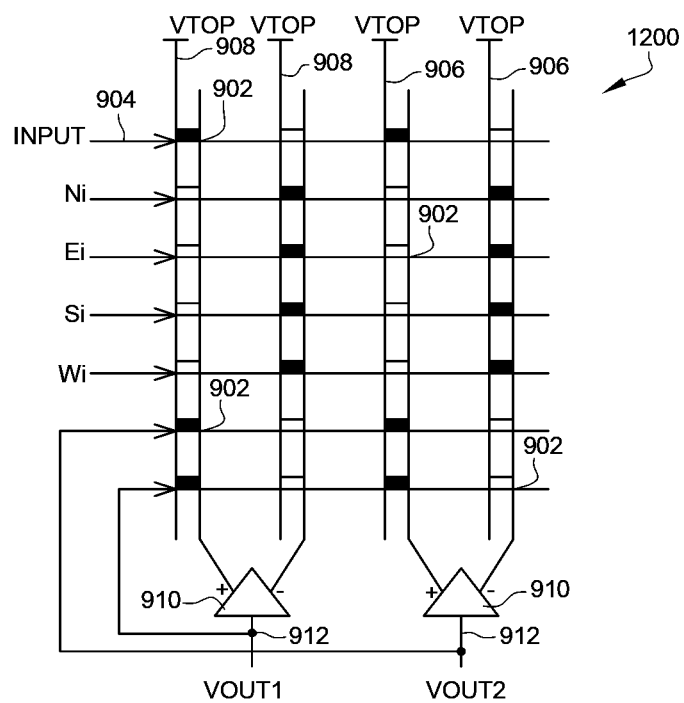
FIG. 12 schematically illustrates a neuron tile in more detail according to yet a further example embodiment of the present disclosure.

FIG. 12 schematically illustrates a neuron tile 1200 in more detail according to yet a further example embodiment.

In the example of FIG. 12, the neuron tile 1200 comprises two columns similar to the example of FIG. 11 in which there are two column lines 908, 908' per column respectively coupled to positive and negative inputs of the computation circuit 910 of each column. The memory cells 902 of each column are coupled to an input line 904 receiving an input voltage INPUT, which is for example an input from an external source of the neural network, such as from an event-based sensor, and to four further input lines Ni, Ei, Si and Wi respectively corresponding to north, east, south and west inputs of the neuron tile 1200. Furthermore, like in the example of FIG. 10, the output voltages VOUT1 and VOUT2 of the computation circuits 910 of the columns are fed back to two respective rows of memory cells 902 of each column line 908, 908' of each column.

FIG. 12 also illustrates an example of the programmed binary state of each memory cell 902, with a solid rectangle representing memory cells 902 programmed with a low resistive state, or with a high programmed state in the case of an SRAM implementation of the memory cells 902, while an empty rectangle represents memory cells 902 programmed with a high resistive state, or with a low programmed state in the case of an SRAM implementation of the memory cells 902. The memory cells 902 of the input signal INPUT and of the feedback voltages VOUT1, VOUT2 are for example programmed such that these signals will be applied to the column lines 908, and the memory cells of the inputs Ni, Ei, Si and Wi are for example programmed such that these signals will be applied to the column lines 908'.

Thus, in operation, the inputs Ni, Ei, Si and Wi from the neighboring neuron tiles will act as inhibitory inputs, and when the input signal INPUT is asserted while the inputs Ni, Ei, Si and Wi are relatively low, the positive feedback will tend to cause the column output to remain high. This type of operation can for example be used to implement a winner-take-all function among a group of neuron tiles.

Figure 13:
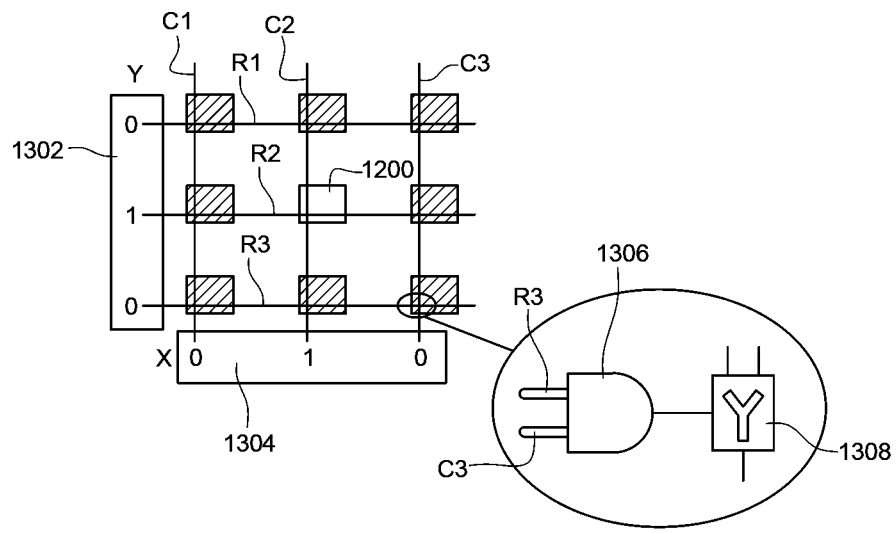
FIG. 13 schematically illustrates a sub-array of nine tiles according to an example embodiment of the present disclosure.

FIG. 13 schematically illustrates a sub-array 1300 of nine tiles according to an example embodiment, and illustrates an example of a programming scheme for programming the memory cells of the memory array of a neuron or routing tile. FIG. 13 illustrates an example of a three by three array of tiles, and of the selection of a central tile 1200 for programming. For example, a row decoder 1302 drives row lines R1 to R3, each row line being coupled to the memory cells of a corresponding row, and a column decoder 1304 drives column lines C1 to C3, each column line being coupled to the memory cells of a corresponding column. Each tile for example comprises an AND gate 1306 having its inputs respectively coupled to the corresponding row and column lines, such that the AND gate outputs a high state when the signal on both the corresponding column line and row line are asserted to the high state. The output of the AND gate 1306 is used to activate the programming of the tile, for example by controlling one or more multiplexers or demultiplexers 1308, as will be described in more detail below.

Figure 14:
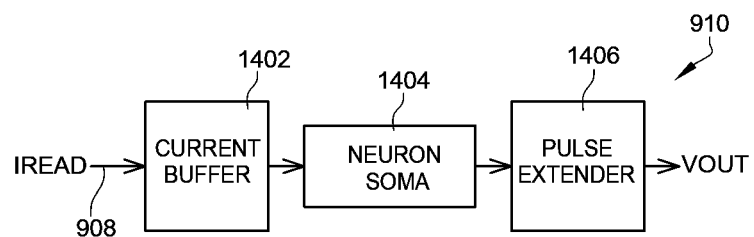
FIG. 14 schematically illustrates a computation circuit of a neuron tile in more detail according to an example embodiment of the present disclosure.

FIG. 14 schematically illustrates the computation circuit 910 of a neuron tile 202, 204 in more detail according to an example embodiment.

The computation circuit 910 for example comprises a current buffer (CURRENT BUFFER) 1402, a neuron soma (NEURON SOMA) 1404, and a pulse extender (PULSE EXTENDER) 1406. The current buffer 1402 receives at its input the signal IREAD from the column line 908, and has its output coupled to the input of the neuron soma 1404, which performs a neuronal summation of the current signal provided by the current buffer. The neuron soma 1404 has its output coupled to the input of the pulse extender 1406. The pulse extender generates the output signal VOUT of the computation circuit 910.

Figure 15:
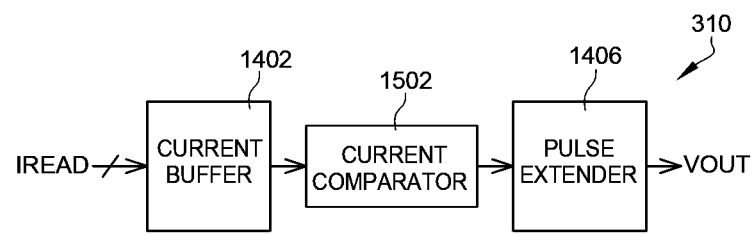
FIG. 15 schematically illustrates a comparator circuit of a routing tile in more detail according to an example embodiment of the present disclosure.

FIG. 15 schematically illustrates the comparator circuit 310 of the routing tile 206 in more detail according to an example embodiment.

The comparator circuit 310 is for example the same as the computation circuit 910, except that the neuron soma 1404 is replaced by a current comparator (CURRENT COMPARATOR) 1502. This means that, rather than performing a neuronal summation, like in the case of a neuron, the comparator circuit performs a comparison leading, for example, to a binary result.

In view of the similarities between the computation circuit 910 of a neuron tile and the comparator circuit 310 of a routing tile, in some embodiments the routing tiles and neuron tiles are implemented by a same circuit, comprising both the neuron soma 1404 and the current comparator 1502, which can be selectively activated as will now be described with reference to FIG. 16.

Figure 16:
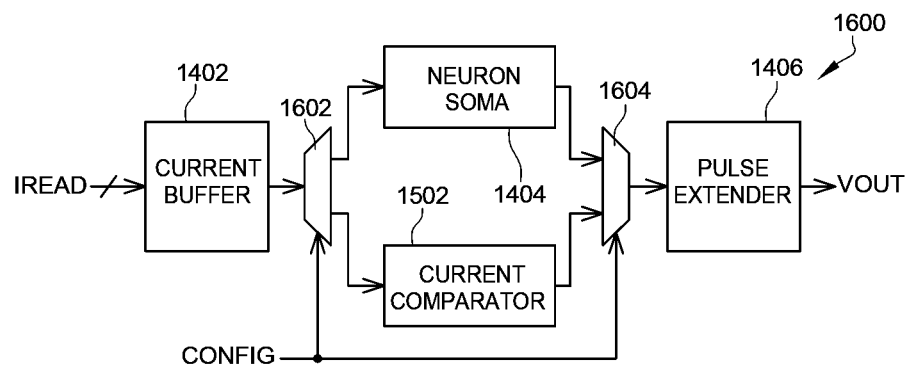
FIG. 16 schematically illustrates a generic computation/comparator circuit capable of implementing part of the column of either a neuron tile or of a routing tile according to an example embodiment of the present disclosure.

FIG. 16 schematically illustrates a generic computation/comparator circuit 1600 capable of implementing part of the column of either a neuron tile or of a routing tile. The circuit 1600 comprises the current buffer 1402, both the neuron soma 1404 and current comparator 1502, and the pulse extender 1406. A demultiplexer 1602 for example couples the output of the current buffer 1402 to either the input of the neuron soma 1404, or to the input of the current comparator 1502. A multiplexer 1604 for example couples either the output of the neuron soma 1404, or the output of the current comparator 1502, to the input of the pulse extender 1406. The demultiplexer 1602 and multiplexer 1604 are for example controlled by a configuration signal CONFIG, which configures the circuit as either a computation circuit with signals passed to and from the neuron soma 1404, or a comparator circuit with signals passed to and from the current comparator 1502. The configuration signal CONFIG is for example generated by the control circuit 504 of FIG. 5A.

Example implementations of the computation circuit 910 and comparator circuit 310 will now be described in more detail with reference to FIGS. 17 to 25. Of course, these implementations are only examples, and it will be apparent to those skilled in the art that there are many alternative implementations that would be possible.

FIG. 17 schematically illustrates a column 1700 of the neuron tile 202, 204 in more detail according to an example embodiment. In contrast to a routing tile, a neuron tile is configured to conserve an analog character of the signal present on each column line.

The column 1700 comprises memory cells 902, three of which are shown in FIG. 17. In the example of FIG. 17, the column supply line 906 is coupled to the supply rail VTOP via a multiplexer 1702, which receives, at a second input, a programming voltage VPROG1. The programming voltage VPROG1 is for example generated by the control circuit 504 of FIG. 5A. The column line 908 is coupled to the computation circuit 910 via a demultiplexer 1704, which couples the column line 908 to the input of the current buffer 1402 of the computation circuit 110, or to a programming voltage VPROG2. Indeed, the programming voltages VPROG1 and VPROG2 together permit a current or voltage signal of one polarity or the other to be applied to a selected memory cell 902. In some embodiments, one of the programming voltages VPROG1, VPROG2 is the ground voltage.

The multiplexer 1702 and demultiplexer 1704 are controlled by a write enable signal WE generated, for example, by the control circuit 504 of FIG. 5A, or by the AND gate 1306 of FIG. 13. The write enable signal WE is for example used for programming of the memory cells 902. For example, the write enable signal WE is used to control the multiplexer 1702 and demultiplexer 1704 such that during a programming mode, the programming voltage VPROG is supplied on the column supply line 906, the column line 908 is coupled to ground, and one of the input signals VIN<1> to VIN<K> is activated to select the memory cell to be programmed. Programming volatile or non-volatile memory cells using voltages is known by those skilled in the art, and will not be described in more detail herein.

In some embodiments, the current buffer 1402 further receives a reference voltage Vref and a biasing voltage Vbias, and outputs a voltage Vw. The current buffer conserves the analog character of the input signal.

The output of the current buffer 1402 is coupled to the input of a superimposed DPI (differential pair integrator) synapse 1706, which performs a current to voltage conversion while conserving the analog character of the input signal. The synapse 1706 also receives the output voltage Vp of a NAND gate 1708. The NAND gate 1708 performs a NAND operation on the input signals VIN<1> to VIN<K> received by the memory cells 902. The synapse 1706 also for example receives voltages Vthr and Vtau, described in more detail below. An output voltage Vi of the synapse 1706 is provided to the neuron soma 1404, which performs an analog addition, and which also for example receives voltages Vlk and Vrp, described in more detail below. The output voltage Vout of the neuron soma 1404 is for example provided to the pulse extender 1406, which also for example receives a voltage Vpw, described in more detail below.

FIG. 18 schematically illustrates a column 1800 of the routing tile 206 in more detail according to an example embodiment.

The column 1800 of the routing tile 206 is similar to the column 1700 of the neuron tile 202, 204, and comprises in particular a multiplexer 1802 and demultiplexer 1804 permitting the memory cells 302 to be programmed in a similar manner to the memory cells 902 described above in relation with FIG. 17. The routing tile 206 comprises for example only the comparator circuit 310 between the column line and the output line providing the output signal VOUT. In particular, in contrast to the neuron tile, the routing tile does not comprise a neuron soma, which is the heart of a neuron. The comparator circuit 310 is also for example similar to the computation circuit 910, except that the elements 1706, 1708 and 1404 are replaced by the comparator 1502, which for example receives, in addition to the voltage Vw generated by the current buffer 1402, an input signal Iref, corresponding to a reference current.

FIG. 19 schematically illustrates an example of a circuit 1900 implementing the multiplexers and demultiplexers 1702, 1704 of FIG. 17 and 1802, 1804 of FIG. 18. In the case of the multiplexers 1702, 1802, the nodes labelled A and B in FIG. 19 form the input nodes and a node labelled Z forms the output node. In the case of the demultiplexers 1704, 1804, the nodes labelled A and B in FIG. 19 form the output nodes and the node Z forms the input node.

The node A is coupled to the node Z by the main conducting nodes of a pair of transistors 1902 and 1904 arranged in parallel, and similarly the node B is coupled to the node Z by the main conducting nodes of a pair of transistors 1906 and 1908 arranged in parallel. The transistors 1902 and 1908 for example have their gates coupled to the control input receiving the write enable signal WE. The signal WE also controls the gates of the transistors 1904 and 1906 via an inverter 1910. The transistors 1902 and 1906 are for example p-channel MOS (PMOS) transistors and the transistors 1904 and 1908 are for example n-channel MOS (NMOS) transistors, the main conducting nodes of these transistors being their sources/drains.

FIG. 20 schematically illustrates the current buffer 1402 of the neuron and routing columns of FIGS. 17 and 18 in more detail according to an example embodiment. The input of the current buffer 1402, which receives the current signal IREAD, is coupled to a node 2002, which is in turn coupled to the ground rail via the main conducting nodes of a transistor 2004 and to the supply voltage rail VDD via the main conducting nodes of a transistor 2006. The transistor 2006 is for example a PMOS transistor and the transistor 2004 is for example an NMOS transistor. The transistor 2006 receives at its gate node the biasing voltage Vbias. The transistor 2004 has its gate coupled to the output of a differential amplifier 2008, which is some embodiments is an operational amplifier, and for example has its positive input coupled to the node 2002, and its negative input coupled to receive the reference voltage Vref. The current buffer 1402 serves to convert the current signal IREAD into the voltage Vw at the output of the differential amplifier 2008, the higher the current IREAD, the higher the voltage Vw. For example, the voltage signal Vw is based on the logarithm of the current READ.

FIG. 21 schematically illustrates a half NAND circuit implementing the NAND gate 1708 of the neuron column 1700 of FIG. 17 in more detail according to an example embodiment of the present disclosure.

The half NAND 1708 for example comprises a transistor 2102 coupling, by its main conducting nodes, a node 2104 to the ground rail, and a parallel arrangement of K transistors coupling, by their main conducting nodes, the node 2104 to the VDD supply rail, three such transistors 2106, 2108 and 2110 being shown in FIG. 21. The transistor 2102 is for example an NMOS transistor, and the K transistors 2106 to 2110 are for example PMOS transistors. The transistors 2106, 2108 and 2110 are respectively controlled at their gates by the voltages VIN<1>, VIN<2> and VIN<K>. A series connection of inverters 2114 and 2116 is coupled to the node 2104 and generates an output voltage Vp of the half NAND 1708.

Figure 22:
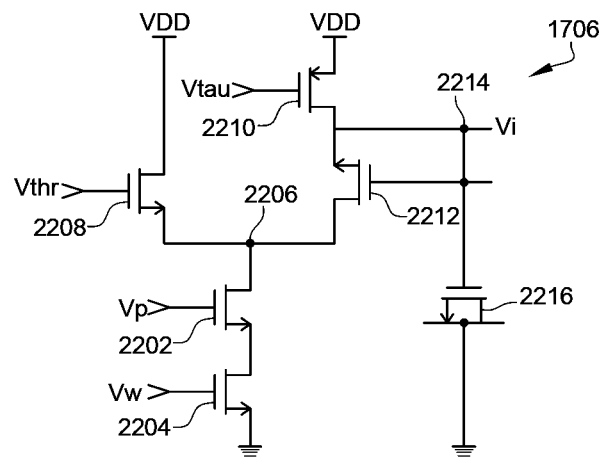
FIG. 22 schematically illustrates a differential pair integrator synapse of the neuron column of FIG. 17 in more detail according to an example embodiment of the present disclosure.

FIG. 22 schematically illustrates the superimposed DPI synapse 1706 of the neuron column of FIG. 17 in more detail according to an example embodiment. The voltage Vp generated by the NAND gate 1708 is for example provided to the gate of a transistor 2202 and the voltage Vw generated by the current buffer 1402 is for example provided to the gate of a transistor 2204. The transistors 2202 and 2204 are for example coupled in series by their main conducting nodes between a node 2206 and the ground rail. The node 2206 is further coupled to the VDD supply rail via the main conducting nodes of a transistor 2208 receiving at its gate the voltage Vthr, and via the series connection, by their main conducting nodes, of transistors 2210 and 2212. The transistor 2210 is controlled at its gate by the voltage Vtau. The transistors 2202, 2204 and 2208 are for example NMOS transistors, and the transistor 2210 is for example a PMOS transistor. The gate of the transistor 2212 is for example coupled to an intermediate node 2214 between the transistors 2210 and 2212, which is also for example the source of the transistor 2212. The node 2214 is for example coupled to ground via a capacitor 2216, which in the example of FIG. 22 is implemented by the gate of a MOS transistor. The node 2214 also for example provides an output voltage Vi of the superimposed DPI synapse 1706. The voltages Vthr and Vtau are for example fixed DC voltages that set a parameter of the column model implemented by the neuron column, but could be varied in some embodiments to tune the model.

In operation, the voltage Vi at the output of the superimposed DPI synapse 1706 for example decreases upon each pulse of the input voltage Vw from the current buffer 1402. Indeed, for each input pulse on the column line, the voltage Vp will go high, and a current that is an exponential function of the voltage bias Vw from the current buffer 1402 (and also of the bias voltage Vthr), will flow from the capacitor 2216 to the ground rail. Thus, every input pulse will cause the voltage Vi to decrease. The capacitor 2216 is also coupled to the VDD rail via the transistor 2210, the biasing voltage Vtau setting the speed at which the capacitor will charge again in the absence of input pulses. Furthermore, when the voltage Vi falls to a certain level, the transistor 2212 will be rendered conductive, causing the input current to the neuron soma 1404 to increase.

Figure 23:
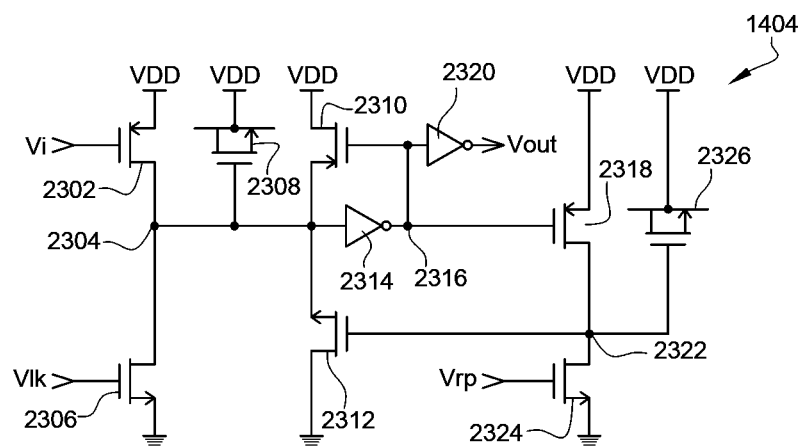
FIG. 23 schematically illustrates a neuron soma of the neuron column of FIG. 17 in more detail according to an example embodiment of the present disclosure.

FIG. 23 schematically illustrates the neuron soma 1404 of the neuron column of FIG. 17 in more detail according to an example embodiment.

The neuron soma 1404 for example comprises a transistor 2302 coupled by its main conducting nodes between the VDD supply voltage rail and a node 2304, and receiving at its gate the voltage Vi generated by the superimposed DPI synapse 1706. The node 2304 is coupled to the ground rail by the main conducting nodes of a transistor 2306, receiving at its gate the input voltage Vlk. The node 2304 is further coupled to the VDD supply rail via a capacitor 2308, for example formed by the gate of a MOS transistor, and via the main conducting nodes of a transistor 2310. The node 2304 is further coupled to the ground rail via the main conducting nodes of a transistor 2312. Furthermore, an inverter 2314 has its input coupled to the node 2304, and its output coupled to a further node 2316. The node 2316 is for example coupled to the gate of the transistor 2310, to the gate of a further transistor 2318, and to the input of an inverter 2320, which provides, at its output, an output voltage Vout of the neuron soma 1404. The transistors 2306 and 2324 are for example NMOS transistors, and the transistors 2302, 2310, 2312 and 2318 are for example PMOS transistors. The transistor 2318 is coupled by its main conducting nodes between the VDD supply rail and a further node 2322, which is in turn coupled to the ground rail via the main conducting nodes of a transistor 2324, to the gate of the transistor 2312, and to the VDD supply rail by a capacitor 2326, which is for example formed by the gate of a MOS transistor. The gate of the transistor 2324 for example receives the voltage Vrp.

In operation, the charge stored by the capacitor 2308 at the node 2304 of the neuron soma 1404 will increase based on the input voltage Vi, and will be reduced by a current conducted by the transistor 2306 based on the signal Vlk, which is for example a fixed biasing voltage. If the voltage at the node 2304 exceeds the threshold level of the inverter 2314, then the neuron soma 1404 will generate a fast output pulse at Vout, and also charge the capacitor 2326, which in turn activates the transistor 2312, which resets the voltage at the node 2304. The duration of the reset period will depend on the biasing voltage Vrp, which causes transistor 2324 to discharge the capacitor 2326. For example, for a supply voltage VDD of around 1.2 V, the voltages Vlk and Vrp are for example in the range 200 to 500 mV, such that the transistors 2306 and 2324 operate in the subthreshold mode.

Figure 24:
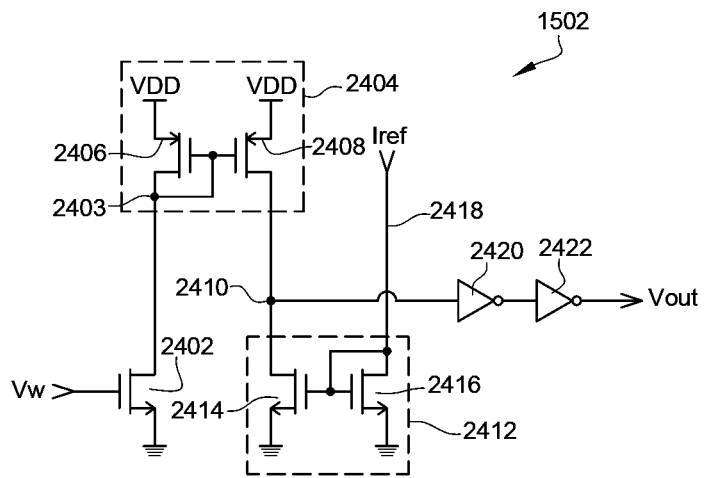
FIG. 24 schematically illustrates a pulse extender of the neuron and routing columns of FIGS. 17 and 18 in more detail according to an example embodiment of the present disclosure.

FIG. 24 schematically illustrates the current comparator 1502 of the routing column of FIG. 18 in more detail according to an example embodiment.

The voltage Vw generated by the current buffer 1402 is for example provided to the gate of a transistor 2402 coupled by its main conducting nodes between a node 2403 and the ground rail. The node 2403 is in turn coupled to a current mirror 2404. The current mirror 2404 is for example formed by a transistor 2406 coupled by its main conducting nodes between the node 2403 and the VDD supply rail, and a transistor 2408 coupled by its main conducting nodes between the VDD supply rail and a further node 2410. The gates of the transistors 2406, 2408 are for example coupled together and to the node 2403. The node 2410 is further coupled to a further current mirror 2412. The current mirror 2412 is for example formed by a transistor 2414 coupled by its main conducting nodes between the node 2410 and the ground rail, and a transistor 2416 having one of its main conducting nodes coupled to the ground rail, which receives a current Iref. The transistors 2402, 2414 and 2416 are for example NMOS transistors, and the transistors 2406 and 2408 are for example PMOS transistors. The gates of the transistors 2414, 2416 are for example coupled together and to the node 2410. The node 2410 is further coupled to the input of an inverter 2420, the output of which is coupled to the input of a further invertor 2422, the output of which provides the output voltage Vout of the current comparator 1502.

In operation, a current proportional to the read current IREAD is generated in the transistor 2402 based on the voltage level Vw, and compared to the reference current Iref. If the reference current Iref is exceeded, a voltage pulse will be generated on the output signal Vout. The width of the pulse is for example equal to, or substantially equal to, the duration that the current IREAD is greater than the current Iref.

Figure 25:
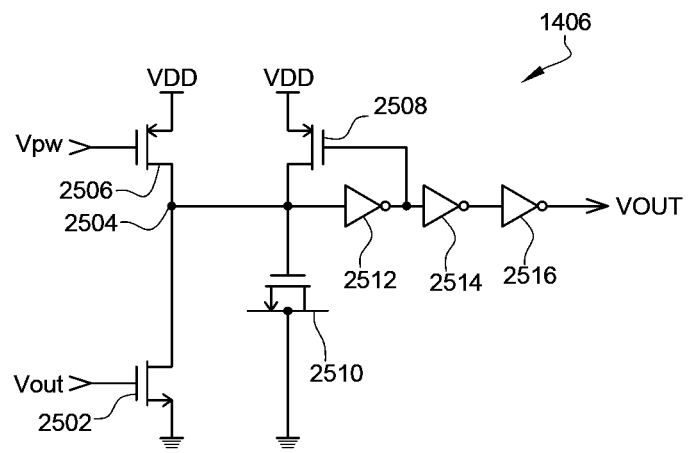
FIG. 25 schematically illustrates a current comparator of the routing column of FIG. 18 in more detail according to an example embodiment of the present disclosure.

FIG. 25 schematically illustrates the pulse extender 1406 of the neuron and routing columns of FIGS. 17 and 18 in more detail according to an example embodiment.

The pulse extender 1406 for example comprises a transistor 2502 coupled by its main conducting nodes between a node 2504 and the ground rail. The node 2504 is further coupled to the VDD supply rail via a transistor 2506 and a transistor 2508, and to the ground rail via a capacitor 2510, which in the example of FIG. 25 is formed by the gate of a MOS transistor. The gate of the transistor 2502 receives the voltage Vout generated by the current comparator 1502 in the case of the routing column of FIG. 18, or the voltage Vout generated by the neuron soma 1404 in the case of the neuron column of FIG. 17. The gate of the transistor 2506 receives the voltage Vpw, which is for example a fixed DC bias voltage. The node 2504 is further coupled to the input of an inverter 2512, the output of which is coupled to the gate of the transistor 2508, and to the input of a further inverter 2514. The output of the inverter 2514 is for example coupled to the input of a further inverter 2516, which provides at its output the output voltage VOUT of the pulse extender 1406. The transistor 2502 is for example an NMOS transistor, and the transistors 2506 and 2508 are for example PMOS transistors.

In operation, a voltage pulse of the signal Vout at the input of the transistor 2502 for example causes the capacitor 2510 to be discharged, and thus causes the output voltage VOUT to go high for a duration until the voltage at the node 2504, which is charged by the transistor 2506, reaches again the threshold level of the inverter 2512.

An advantage of the embodiments described herein is that, by providing routing tiles for interconnecting neuron tiles in a neural network, the routing tiles comprising memory cells for programming the interconnections, these memory cells can be distributed spatially in the computing fabric and offer the possibility of dense local connectivity among neurons, making the architecture particularly suitable for supporting bio-inspired computing systems. Furthermore, it is possible to provide a relatively high fan-in and fan-out, a relatively high level of configurability and a relatively low static power consumption.

Various embodiments and variants have been described. Those skilled in the art will understand that certain features of these embodiments can be combined and other variants will readily occur to those skilled in the art.

What is claimed is:

1. An artificial neural network comprising:
a plurality of routing circuits; and
a plurality of neuron circuits not forming part of the plurality of routing circuits, each neuron circuit having at least one input line and at least one output line;
each routing circuit of the plurality of routing circuits coupling one or more output lines of one or more first neuron circuits among the plurality of neuron circuits to one or more input lines of one or more second neuron circuits among the plurality of neuron circuits, wherein each routing circuit comprises:
a first memory cell having an input coupled to a first input line of the routing circuit and an output coupled to a first column line;
a second memory cell having an input coupled to a second input line of the routing circuit and an output coupled to the first column line; and
a first comparator circuit configured to compare a signal on the first column line with a reference level, and to selectively assert a signal on a first output line of the routing circuit based on the comparison.

2. The artificial neural network of claim 1, wherein the first comparator circuit has an input connected to the first column line, and the first comparator circuit does not comprise a neuron soma.

3. The artificial neural network of claim 1, wherein the first and second memory cells store routing data indicating a routing to be applied between the one or more output lines of the one or more neuron circuits and the one or more input lines of the one or more neuron circuits.

4. The artificial neural network of claim 1, wherein each routing circuit further comprises:
   a third memory cell having an input coupled to the first input line of the routing circuit and an output coupled to a second column line;
   a fourth memory cell having an input coupled to the second input line of the routing circuit and an output coupled to the second column line; and
   a second comparator circuit configured to compare a signal on the second column line with a reference level, and to selectively assert a signal on a second output line of the routing circuit based on the comparison.

5. The artificial neural network of claim 1, wherein:
   the first memory cell is configured to store a first activation bit, wherein the first memory cell is configured to assert a signal on the first column line when the first activation bit and a signal on the first input line of the routing circuit are asserted; and
   the second memory cell is configured to store a second activation bit, wherein the second memory cell is configured to assert a signal on the first column line when the second activation bit and a signal on the second input line of the routing circuit are asserted.

6. The artificial neural network of claim 5, wherein the first and second memory cells are configured to assert current signals on the first column line.

7. The artificial neural network of claim 1, wherein first and second memory cells comprise non-volatile storage elements, such as resistive memory elements.

8. The artificial neural network of claim 1, wherein each neuron circuit comprises:
   a first memory cell having an input coupled to a first input line of the neuron circuit and an output coupled to a first column line of the neuron circuit;
   a second memory cell having an input coupled to a second input line of the routing circuit and an output coupled to the first column line of the neuron circuit; and
   a first computation circuit comprising a first neuron soma.

9. The artificial neural network of claim 8, wherein the first and second memory cells of each neuron circuit each store a synaptic weight.

10. The artificial neural network of claim 8, further comprising:
    a third memory cell having an input coupled to the first input line of the neuron circuit and an output coupled to a second column line of the neuron circuit;
    a fourth memory cell having an input coupled to the second input line of the neuron circuit and an output coupled to the second column line; and
    a second computation circuit comprising a second neuron soma.

11. The artificial neural network of claim 1, comprising an array of tiles, each tile of the array being either one of the routing circuits or one of the neuron circuits, wherein interconnections are formed between neighboring tiles in the array.

12. The artificial neural network of claim 11, wherein the array is configured such that each neuron circuit is coupled to one or more other neuron circuits of the array via one of the routing circuits, or via the series connection of a plurality of the routing circuits.

13. The artificial neural network of claim 12, wherein the array is arranged such that each neuron circuit has at least four neighboring routing circuits.

14. The artificial neural network of claim 1, wherein the plurality of neuron circuits and the plurality of routing circuits are formed in a plurality of layers of a 3-dimensional circuit structure.

15. A method of routing signals between neuron circuits of an artificial neural network, the artificial neural network comprising: a plurality of routing circuits, a plurality of neuron circuits not forming part of the plurality of routing circuits, each neuron circuit having at least one input line and at least one output line; each routing circuit of the plurality of routing circuits coupling one or more output lines of one or more first neuron circuits among the plurality of neuron circuits to one or more input lines of one or more second neuron circuits among the plurality of neuron circuits, the method comprising:
    programming a first memory cell of a first of the routing circuits, the first memory cell having an input coupled to a first input line of the first routing circuit and an output coupled to a first column line;
    programming a second memory cell of the first routing circuit, the second memory cell having an input coupled to a second input line of the routing circuit and an output coupled to the first column line;
    comparing, by a first comparator circuit, a signal on the first column line with a reference level; and
    selectively asserting a signal on a first output line of the routing circuit based on the comparison.

* * * * *